United States Patent [19]

Löbach

[11] 4,379,831
[45] Apr. 12, 1983

[54] PROCESS FOR TRANSFERRING A PATTERN ONTO A SEMICONDUCTOR DISK

[75] Inventor: Ernst Löbach, Eschen, Liechtenstein

[73] Assignee: Censor Patent- und Versuchs-Anstalt, Vaduz, Liechtenstein

[21] Appl. No.: 261,164

[22] PCT Filed: Sep. 19, 1980

[86] PCT No.: PCT/EP80/00101

§ 371 Date: May 21, 1981

§ 102(e) Date: May 7, 1981

[87] PCT Pub. No.: WO81/00923

PCT Pub. Date: Apr. 2, 1981

[30] Foreign Application Priority Data

Sep. 21, 1979 [EP] European Pat. Off. ........ 79103567.8

[51] Int. Cl.³ .................... G03C 5/04; G03C 5/00; G03B 27/32; G03B 27/52
[52] U.S. Cl. ..................... 430/311; 430/273; 430/325; 430/326; 430/327; 430/396; 430/950; 355/27; 355/30
[58] Field of Search ............. 430/273, 327, 311, 313, 430/396, 950, 961, 325, 326; 355/27, 30

[56] References Cited

U.S. PATENT DOCUMENTS 3,458,311 7/1969 Alles ................................. 430/273
3,573,975 4/1971 Dhaka et al. ....................... 430/271
3,652,273 3/1972 Htoo ................................. 430/273
3,719,487 3/1973 Schutze et al. .................... 430/396
3,895,949 7/1975 Aktamatsu et al. ................ 430/273
4,200,463 4/1980 Flowers ............................ 430/327

OTHER PUBLICATIONS

Moreau et al., "Topcoat for Prevention . . . Failure", *IBM Techn. Disclosure Bull.*, vol. 12, No. 9, 2/1970, p. 1417.
Moreau, "Topcoat Formulation . . . Resists", *IBM Techn. Disclosure Bull.*, vol. 12, No. 9, 2/1970, pp. 1418 & 1419.
Feng et al., "*Fabrication of Devices . . . Method*", *IBM Techn. Disclosure Bull.*, vol. 21, No. 6, 11/1978, pp. 2325, 2326.

*Primary Examiner*—Richard L. Schilling
*Attorney, Agent, or Firm*—Karl F. Ross

[57] ABSTRACT

A planar, solid, light-transmitting coating (7) is applied directly to a photoresist layer (6) before the exposure of the latter in the production of integrated circuits by photolithography. Any dust particles will thus be held separated from the photoresist layer (6) by a distance at which they are less effective optically. The probability of the occurrence of standing waves is reduced by increasing the total thickness of the combined layer (6+7) covering the semiconductor (5) proper.

6 Claims, 5 Drawing Figures

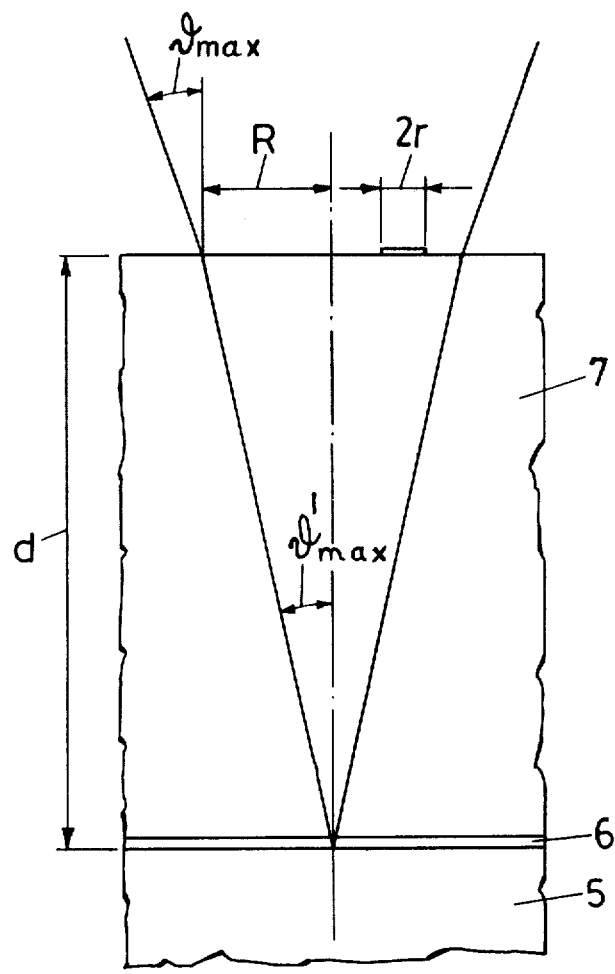
Fig. 2
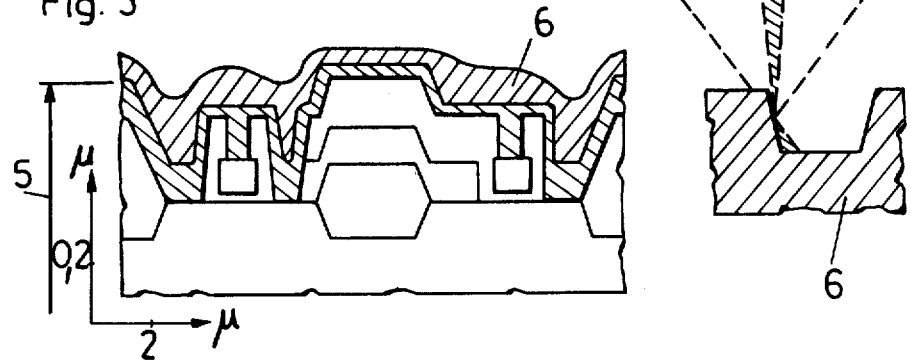
Fig. 3
Fig. 4

PROCESS FOR TRANSFERRING A PATTERN ONTO A SEMICONDUCTOR DISK

FIELD AND BACKGROUND OF THE INVENTION

In the production of integrated circuits, it is known to image a number of masks with different configurations onto a substrate whose surface is modified by exposure to light. The substrate is subjected to physical and chemical changes between successive images, such as a removal of the exposed or unexposed part of a photoresist applied to the substrate and the etching of underlying layers. The photoresist is conventionally termed "positive" in the first and "negative" in the second instance.

Whereas vertical structuring is readily possible today in the processing of integrated circuits by modern doping techniques and highly developed methods for the deposition of layers onto semiconductor surfaces, the possibilities for horizontal structuring are considerably more limited. A refinement of the lateral structuring of integrated circuits of the semiconductor disk is therefore the object of considerable present efforts.

While in the past it used to be the practice to contact the pattern-bearing mask directly with the substrate during the exposure step, the greater present-day requirements for accuracy have more recently led to imaging the mask onto the substrate with interposition of an objective (projection exposure). Moreover, there is also a tendency to simplify the production of several identical patterns on a single wafer by a stepwise shifting of the image instead of using a mask provided with a corresponding plurality of patterns.

OBJECT OF THE INVENTION

Since alternatives to optical lithography in the production of integrated circuits are not yet available or not yet sufficiently developed for practical applications, additional advances are to be expected mainly by the elimination of drawbacks which presently occur in projection exposure. My present invention, therefore, aims in particular at reducing the contamination problem along with elimination of a number of other present-day difficulties.

SUMMARY OF THE INVENTION

Impurities on a semiconductor disk can exist between the substrate and the photoresist as well as on the surface of the latter. Contaminating particles at the boundary layer between the semiconductor and the photoresist are less critical. If they are located fully in a bright or dark field they do not have any disadvantageous effect at all, since they can be considered as a filler of the photoresist. They remain during development in the photoresist and are either dissolved with the resist or flushed away. However, dust particles at the surface of the photoresist are critical since they act as mask defects and completely shield the underlying photoresist portions.

The accumulation of dust particles at the upper surface of the semiconductor disk already prepared for exposure is difficult to avoid even with greatest care for the reason that the time between the preparation and the exposure cannot be reduced to the extent desired from the point of view of keeping the surface clean. Between the individual process steps, however, substantial delays frequently occur on account of the production of semiconductor disks in lots of typically 50 to 100 pieces. This, accordingly, is not a continuous process where dwell times can be minimized. In operation, on the contrary, an equalization of the work load of the equipment is considered of principal importance.

On the assumption that contamination by minute dust particles is substantially unavoidable, my invention reduces its damaging effects by applying a planar, solid light-transmitting coating directly onto the photoresist before the exposure. This coating has a thickness where the spherical aberration defined by the formula $$A = d\left(\frac{1}{n} - \frac{\cos\theta_{max}}{\sqrt{n^2 - \sin^2\theta_{max}}}\right)$$

(d = thickness of the coating, n = index of refraction of the coating, $\theta_{max}$ = maximum angle of incidence of the light onto the coating) amounts to less than the Rayleigh depth, preferably to less than one third of that depth. This light-transmitting coating is fully removed after exposure and not later than upon the partial removal of the photoresist.

The contaminants accumulating on the disk between its preparation for exposure and the actual exposure operation are thus no longer disposed directly on the photoresist but are separated therefrom so that light can reach the region of the photoresist located below the contaminants. The effectiveness of the coating increases with its thickness, yet even layer thicknesses of the magnitude of a few microns can effect a considerable improvement as long as the contaminating particles are sufficiently small. An upper limit for the thickness of the coating results from the fact that the coating represents a plane-parallel layer, which results in an aperture error. This aperture error corresponds to the spherical aberration caused by a lens having an infinite radius of curvature. The error entails the result that the image-generating rays incident at another angle converge in a plane different from that of the vertically incident rays whereby a point is imaged as a line parallel to the axis. This can be tolerated as long as the length of this line $A_s$ stands in a reasonable relationship with the depth of focus (Rayleigh depth), which is defined for a given wavelength $\lambda$ by the formula $t_R = \lambda/NA^2$ (NA = numerical aperture). This is the reason why my invention does not allow for coatings of just any thickness.

The properties of the photoresist employed and in particular its index of refraction are to be taken into account when choosing the coating to be provided in accordance with the present invention.

One of the biggest problems in the exposure of photoresist layers on semiconductor disks, especially in the production of fine structures, involves the homogeneous exposure of the complete image field. A nonuniformity of about 1 percent is considered a good guide value. The uniform illumination of the image field is in fact a necessary but by far not a sufficient condition to achieve the goal desired. This would be only the case if the semiconductor-disk surface with the photoresist layer deposited thereon were itself homogeneous. However, this is not the case at the latest after the first lithographic step, since now the desired structures have been generated.

During the various production steps of an integrated circuit there generally exist numerous discontinuities, grooves, elevations, slopes, etc. on the semiconductor surface. If a photoresist is applied to such a surface, variations in the layer thickness unavoidably result. The profile of the photoresist surface follows only roughly the profile of the photoresist/substrate interface after the drying process.

If light impinges upon such a photoresist layer, then the following physical events occur successively.

The incident light is partially reflected at the air/photoresist interface and is partially refracted. The refracted part passes into the photoresist layer and contributes to the exposure (as long as it is of the proper wavelength). Upon incidence at a glancing angle, as for example at steep slopes of the photoresist surface, the reflected part increases rapidly.

The incident light decreases according to the absorption coefficient of the photoresist and strikes more or less weakened the photoresist/substrate interface, being in part absorbed by the interface and in part reflected. The reflected part passes with further weakening to the photoresist/air interface and is again in part reflected at this interface and in part transmitted with refraction. At certain locations there is even total reflection.

The light waves traveling back and forth inside the photoresist layer interfere and form standing waves. These standing waves contribute significantly to the exposure of the photoresist layer. The intensity of the standing waves depends to a large extent on the local thickness of the photoresist. The formation of the standing waves is weakened if substantial absorption occurs within the photoresist or at its interface. However, this situation does not generally occur.

The large reflection with glancing incidence at slopes and the varying intensity of standing waves caused by nonuniform photoresist thickness are mainly responsible for the occurrence of an inhomogeneous exposure of photoresist layers on structured semiconductor disks despite uniform illumination. This inhomogeneous exposure is the reason for a variation of the line widths of linear structures to be generated from the photoresist layer. The more the above-mentioned effects appear, the higher are the requirements as to image contrast, that is the so-called MTF values (modulation transfer function) have to be large for a sharp image. Vice versa, in the absence of perturbing effects also smaller MTF values can be processed, i.e. finer lines can be produced with a given numerical aperture.

According to the state of the art it is only imperfectly possible to eliminate the aforementioned perturbing effects by trying to keep the thickness variations of the photoresist layer low and by employing photoresists with high absorption, which on the other hand have the disadvantage of requiring long exposure times.

However, if in accordance with a preferred embodiment of the present invention the disk covered with a photoresist layer is provided with a coating whose index of refraction corresponds to that of the photoresist, then the photoresist/coating interface disappears completely from the optical viewpoint. This gives the result that even with a low layer thickness glancing incidence does not occur any longer, since the surface of the coating is substantially planar and practically does not follow anymore the vertical contours of the semiconductor disk. Moreover, the importance of the exposure differences caused by interfering standing waves decreases with increasing layer thickness. In any case, the presence of standing waves becomes negligible as soon as the thickness of the coating surpasses half the coherence length of the exposure light which is on the order of magnitude of 10 to 100$\mu$ for conventional high-pressure mercury-arc lamps. This coherence length, defined as $l_K = \lambda^2/\Delta\lambda$, is, however, only a statistical average value so that a coating thickness equal to half the coherence length does not immediately eliminate the interference effects but these decrease considerably already before this thickness is reached.

When producing coatings in accordance with the present invention it is important to begin the application of the coating immediately after the drying of the photoresist, that is before a substantial contamination of the surface thereof can take place. Preferably the material eventually forming the solid coating is applied in the form of a solution whose solvent must not attack the photoresist. For example, with a positive photoresist comprising a phenolic resin the solvent cannot be xylene or ethylene glycol but can be, for example, methanol, ethanol, benzene, chloroform or trichloroethylene. In order to fill also the smallest spaces on the photoresist surface, the coating material in its dissolved form should be able to wet the photoresist. Despite good wetting, the dissolved coating material has to be easily removable from the photoresist layer in order to allow for further problem-free processing. A limited water-absorption capacity is advantageous, since smallest droplets of water are not completely unavoidable at the photoresist surface but are thereby dissolved and rendered optically ineffective. Canada balsam dissolved in one of the cited solvents is preferred for the production of the layer in accordance with my invention. The canada balsam is, like the photoresist, applied with a spinner. At the same time or thereafter the semiconductor disk is heated to a temperature preferably below 90° C., which does not damage the photoresist, for evaporation of the solvent. It is essential that the semiconductor disk now rests in a completely horizontal position in order to form in the following cooling and solidifying step a plane-parallel, mirror-smooth surface of the coating with a thickness of, for example, 10$\mu$ consisting of the solid contents of the canada balsam.

The coating is dissolved after exposure of the semiconductor disk prepared as described above, without attack on the exposed photoresist, again with a solvent such as methanol, ethanol or the like. The freed photoresist layer is developed in known manner, as for example by dissolving the exposed areas of a positive photoresist of phenolic resin with sodium hydroxide. Then the further steps conventional in semiconductor processing follow.

BRIEF DESCRIPTION OF THE DRAWING

The above and other features of my invention will now be described in detail with reference to the accompanying drawing in which:

FIG. 2 shows the ray path through a semiconductor disk, provided with a coating in accordance with the invention, in the area of a dust particle;

FIG. 3 is a microscopic cross-section through the surface of a semiconductor disk not yet provided with the coating according to the present invention;

FIG. 4 is a schematic representation of a non-planar surface for illustrating the phenomenon of glancing incidence.

SPECIFIC DESCRIPTION

Figure 1:
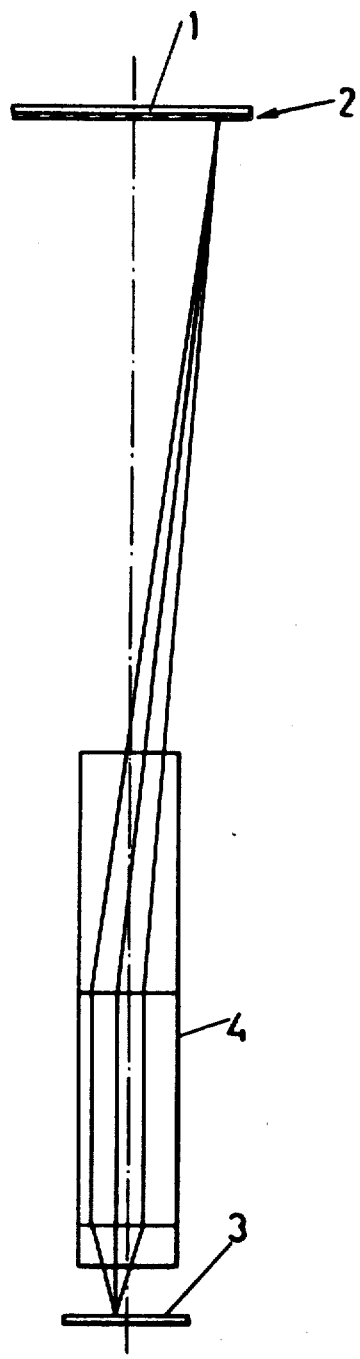
FIG. 1 schematically illustrates a system for the projection exposure of semiconductor disks.

The conventional mode of transfer of a pattern to a semiconductor disk covered with a photoresist is shown very schematically in FIG. 1. Light of a wavelength suitable for chemically or physically changing a photoresist passes from a nonillustrated light source to a carrier disk 1 provided with a mask 2. The bright and dark spots on the mask 2 are sharply imaged on a semiconductor disk 3, usually termed a wafer, by way of a projection objective 4. As seen in FIG. 2, the semiconductor substrate 5 of wafer 3 is overlain not only by a photoresist layer 6 but also, pursuant to my invention, by a coating 7 covering that layer during the exposure. The refractive index of coating 7 preferably deviates by not more than 10% from that of layer 6. The effect of this coating in reducing the significance of unavoidable contaminants can be easily gathered from FIG. 2. An elemental beam of light rays from objective 4, having a maximum aperture angle $\theta_{max}$ corresponding to a numerical aperture (NA) given by $\sin \theta_{max}$, converges onto the coating 7 of thickness d and, as this thickness increases, is blanked out less and less by a disk of radius r, deposited on the coating, which is to represent a dust particle. Let us consider, for example, a particle of a diameter of $2\mu$, which in immediate contact with photoresist 6 can render a semiconductor element useless. If such particle is to cause only a local exposure inhomogeneity of a permissible percentage p, the thickness of the coating can be calculated as follows:

$$\sin\theta_{max} = NA = n \cdot \sin\theta'_{max} \approx n \cdot \tan\theta'_{max}$$

$$\tan\theta'_{max} = \frac{R}{d} \quad \frac{r^2\pi}{R^2\pi} = \frac{p}{100}$$

$$d = \frac{R}{\tan\theta'_{max}} \approx \frac{10r \cdot n}{NA \cdot \sqrt{p}}$$

Radius R represents half the width of an elemental beam of apex angle $2\theta_{max}$ originating at a given point of mask 2 which is being focused upon a conjugate point of layer 6.

Assuming an index of refraction of 1.6 for the coating 7 as well as for the photoresist 6 and a numerical aperture of 0.35, a permissible local exposure inhomogeneity of p=9% can already be achieved with a coating 7 having a thickness $d=16\mu$. As clearly shown in FIG. 2, the value of d greatly exceeds the thickness of photoresist layer 6. With the values given, $R \approx 3\mu \approx 3r$.

As can be recognized from FIG. 3, the photoresist layer 6 on the semiconductor 5 exhibits considerable variations in thickness; the maximum value of this thickness, as shown, is approximately $0.2\mu$. These variations result from the fact that upon the application of the liquid photoresist there is initially formed a planar photoresist surface, independent of the underlying structure, which after drying due to loss of solvent follows approximately, but not exactly, the profile of the substrate surface. Grooves in the surface are covered with a considerably higher layer thickness than protrusions from the surface.

The illustrated thickness variations of the photoresist layer are very significant since the thickness of that layer determines whether the standing waves generated therein are amplified or weakened by interference. For the theory dealing with this effect, reference may be made for instance to the publications of J. D. Cuthbert, Solid State Technology, August 1977, page 59, Dietrich W. Widmann, Applied Optics, April 1975, Vol. 14, No. 4, page 932, and Dietrich W. Widmann and Hans Binder, IEEE Transactions on Electron Devices, Vol. ED-22, No. 7, July 1975, pages 467-469.

In the most unfavorable case a local difference in the luminous intensity arising from differences in the thickness of the photoresist, despite homogeneous illumination, can cause an increase in the exposure time by a factor of 2.5 for the poorly exposed regions. More serious than the consequently required increase in exposure time is the fact that the varying light sensitivity, caused by the thickness differences of the photoresist layer, necessitates a higher image contrast, thus decreasing the possibility of imaging fine lines.

Any attempt to make the thickness of the photoresist layer as constant as possible, in order to reduce the disadvantage discussed above, does not appear very promising. Moreover, accurate copying of the vertical structure of the semiconductor 5 by the photoresist layer 6 would result in unevenness at the top surface of the photoresist layer which in turn would have the disadvantage of glancing irradiation as can be recognized from FIG. 4.

Figure 5:
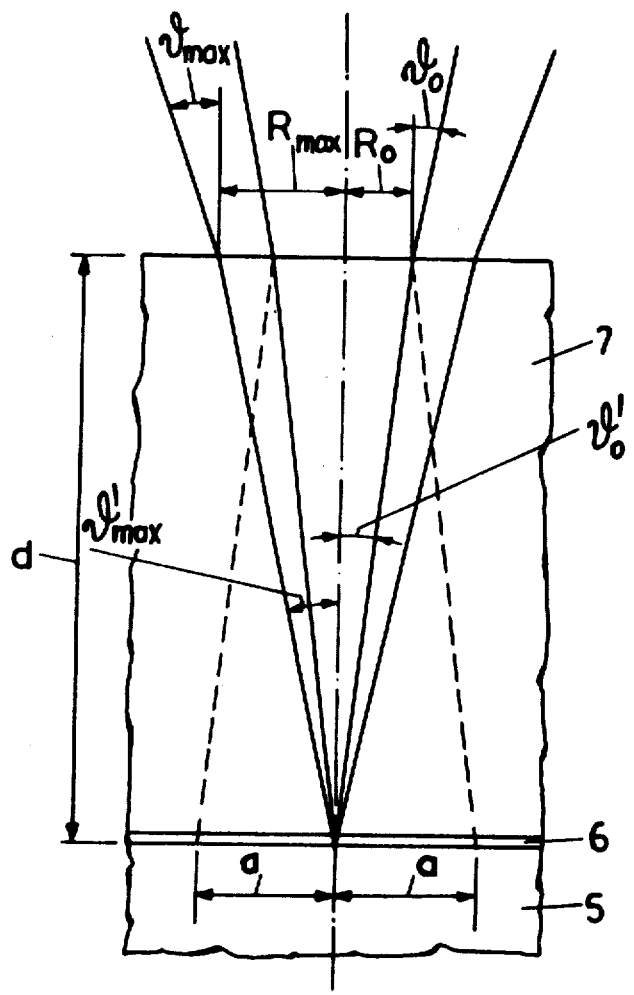
FIG. 5 diagrammatically illustrates the occurrence of standing waves.

As can be seen from FIG. 4, glancing incidence of the light at the flanks of a groove results in an overexposure of the groove bottom through reflected rays. This effect could only be suppressed by providing the photoresist layer with a planar surface, which again is not compatible with the requirement of a constant thickness. My present invention solves this dilemma by substantially conforming the index of refraction of the coating 7 to that of the photoresist so that the two deposits 6 and 7 optically form a single layer. The top surface of this layer can be readily made practically planar, thus obviating the problem of glancing incidence. At the same time, and this is of greater importance, in such a layer with a thickness amounting to a multiple of the illuminating wavelength the aforementioned interference effects occur only to a nondamaging extent. A certain layer thickness is required for the interference effects to become harmless. Thus it would be possible to provide a layer thickness of more than half the coherence length, yet I shall show hereinafter with reference to FIG. 5 that layers of such thickness, even though they would be permissible from the viewpoint of the aperture error, are not required for minimizing the influence of the standing waves.

If a designates the resolving power of the projection objective, that is the shortest distance by which two lines can be separated from each other on the semiconductor layer 5, then incident light rays reflected back into photoresist 6 first at the interfaces of layers 5 and 6 and then at the outer surface of coating 7 will significantly contribute to the interference effects only when they impinge within a circle of radius a around the image point. Within the overall beam of aperture angle $\theta_{max}$ these light rays represent a bundle with the smaller aperture angle $\theta_o$, which forms a circle of radius $R_o = a/2$ on the upper surface of the coating. It can be recognized immediately that, by analogy with the observations discussed in the context of FIG. 2, the influence of this bundle passing through the circle of radius $R_o$ decreases with increasing thickness of the coating 7. The proportion of the light incident under the maximum aperture angle $\theta_{max}$, which lies within the angle $\theta_o$ and is therefore the only one substantially influenced by the occurrence of standing waves, is found by a simple calculation to equal about $$\frac{a^2 n^2}{4d^2 NA^2}$$

and therefore can be rendered insignificant by selection of a coating 7 of an appropriate thickness d. A coating thickness of 5μ can be sufficient for this purpose. For the suppression of contamination as well as minimization of the effect of the standing waves there is therefore available a relatively wide range, from a few microns to about 50μ, within which the thickness of the coating can be selected according to production requirements. A relatively thin layer is generally easier to produce and is also easier to dissolve.

It will be noted that a decrease of angle $\theta_o$ coupled with an increase in the thickness d of the coating lets only a relatively small part of the twice reflected light contribute to a sharp image of the mask. However, this does not pose a problem since the proportion of the twice reflected light to overall intensity—even in the case of a vertical incidence—is not larger than $$\left(\frac{n-1}{n+1}\right)^2,$$

which for n=1.6 corresponds to a value of about 5%.

I claim:

1. In a process for photolithographically transferring a pattern from a mask onto a semiconductor wafer by covering a semiconductor substrate thereof with a photoresist layer, imaging said pattern on said photoresist layer by means of a projection objective of predetermined numerical aperture NA=sin $\theta_{max}$ where $\theta_{max}$ is half the apex angle of an elemental beam converging from said objective onto said photoresist layer, and thereafter removing exposed portions of said photoresist layer, a method of suppressing the effects of minute dust particles upon the projected image, comprising the steps of (a) depositing on said photoresist layer a planar, solid and light-transmitting coating of refractive index n corresponding at least approximately to that of said photoresist layer, said coating having a thickness d of at least several microns substantially exceeding that of said layer and sufficient to let an elemental beam strike the outer surface of said coating on an area substantially greater than that of a dust particle having a radius of one micron, said thickness d lying in a range in which the resulting spherical aberration given by $$d\left(\frac{1}{n} - \frac{\cos\theta_{max}}{\sqrt{n^2 - \sin^2\theta_{max}}}\right)$$

is less than the Rayleigh depth, and (b) removing said coating not later than with the removal of said exposed portions.

2. The method defined in claim 1 wherein said area has a radius of several microns.

3. The method defined in claim 1 or 2 wherein said spherical aberration is less than a third of the Rayleigh depth.

4. The method defined in claim 1 or 2 wherein the indices of refraction of said photoresist layer and said coating differ from each other by not more than about 10%.

5. The method defined in claim 1 or 2 wherein said photoresist layer is a phenolic resin, said coating being produced by a deposition of canada balsam in a solvent selected from the group which consists of methanol, ethanol, benzene, chloroform and trichloroethylene.

6. The method defined in claim 5 wherein the solvent is removed by heating the canada balsam to an elevated temperature below 90° C.

* * * * *